United States Patent
Pirner et al.

(10) Patent No.: US 7,201,585 B2
(45) Date of Patent: Apr. 10, 2007

(54) ELECTROMECHANICAL SUBASSEMBLY

(75) Inventors: Hermann Pirner, Illschwang (DE);
Robert Weber, Forchheim (DE);
Thomas Urbanek, Nuremberg (DE)

(73) Assignee: Conti Temic microelectronic GmbH,
Nuremberg (DE)

( * ) Notice: Subject to any disclaimer, the term of this patent is extended or adjusted under 35 U.S.C. 154(b) by 0 days.

(21) Appl. No.: 10/540,000

(22) PCT Filed: Oct. 8, 2003

(86) PCT No.: PCT/DE03/03326

§ 371 (c)(1),
(2), (4) Date: Oct. 18, 2005

(87) PCT Pub. No.: WO2004/060723

PCT Pub. Date: Jul. 22, 2004

(65) Prior Publication Data

US 2006/0068615 A1    Mar. 30, 2006

(30) Foreign Application Priority Data

Dec. 20, 2002  (DE) ................................. 102 59 850

(51) Int. Cl.
*H01R 1/00* (2006.01)

(52) U.S. Cl. .................. 439/76.1; 439/76.2; 303/119.3

(58) Field of Classification Search .............. 439/76.1, 439/76.2; 303/119.3
See application file for complete search history.

(56) References Cited

U.S. PATENT DOCUMENTS

| 5,941,282 | A | 8/1999 | Suzuki et al. |
| 6,354,674 | B1* | 3/2002 | Iwamoto et al. ......... 303/119.3 |
| 6,662,825 | B2 | 12/2003 | Frank et al. |
| 6,881,077 | B2* | 4/2005 | Throum .................... 439/76.1 |
| 2002/0112765 | A1 | 8/2002 | Frank et al. |

FOREIGN PATENT DOCUMENTS

| DE | 43 40 280 | 3/1995 |
| EP | 1 241 386 | 9/2002 |
| FR | 2 741 118 | 5/1997 |

* cited by examiner

*Primary Examiner*—X. Chung-Trans
(74) *Attorney, Agent, or Firm*—W. F. Fasse; W. G. Fasse

(57) ABSTRACT

An electromechanical subassembly has a cover control module equipped with a printed circuit and with first contacts, a mechanical module equipped with second contacts and a support module for securing the cover control module and the mechanical module to the support module. The support module includes first electrical terminals for contacting the first contacts, second electrical terminals for contacting the second contacts and at least one electrical connector for contacting the electromechanical subassembly and the control circuit forming part of the cover.

10 Claims, 1 Drawing Sheet

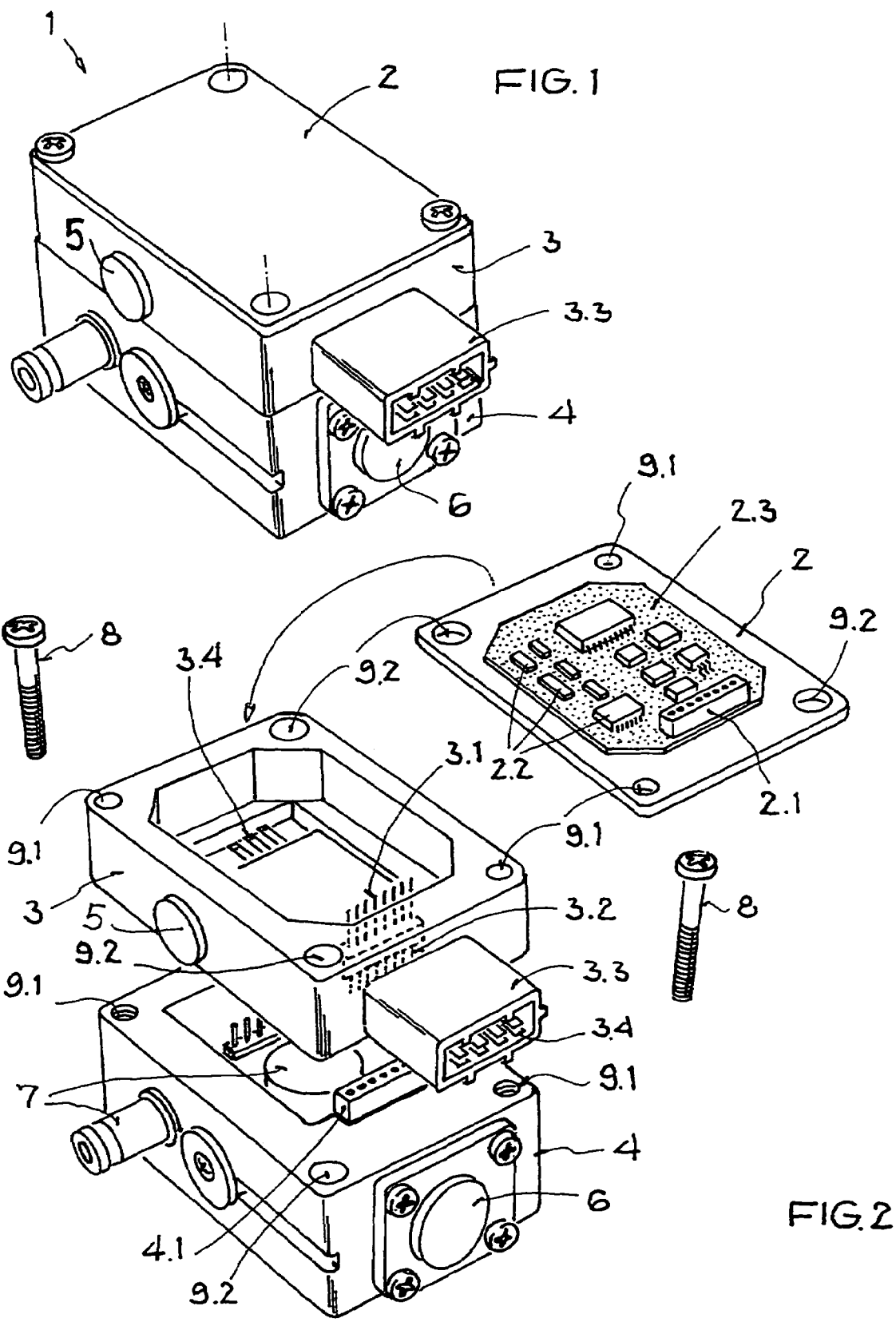

ELECTROMECHANICAL SUBASSEMBLY

FIELD OF THE INVENTION

The invention relates to an electromechanical subassembly of electronic and mechanical components.

BACKGROUND INFORMATION

Subassemblies, which are produced and distributed as intermediates, as a rule are equipped with customized specific features. In case of subassemblies with electronic components these are e.g. the electrical connection device of the electronic component, via which the electronic component is connected by means of a customized connection element for instance to a power supply or to a control device assigned to the electronic subassembly.

In this case adaptation of the subassembly to the customized features in its production results in that several housings differing for instance in said electrical connection devices, must be produced for receiving the electronic component. Thus, the number of the housings to be produced identically is reduced, whereby the production costs for the subassembly highly increase.

SUMMARY OF THE INVENTION

It is the object of the invention to indicate an electromechanical subassembly, in which the housing is embodied to be compatible with different housing variants in terms of its internal and external contact terminals and which nevertheless can be produced at low costs. Moreover, the components and partial components forming part of the electromechanical subassembly should be combinable as compact as possible.

This object has been achieved in accordance with the invention by an electromechanical subassembly with the features set forth herein.

Accordingly, an electromechanical subassembly is provided with a cover constructed as a control module equipped with first contacts, a mechanical module with second contacts, a support module for securing the control module cover and the mechanical module to the support module, said support module comprising first terminals for contacting the first contacts, second terminals for contacting the second contacts and at least one connection device or electrical connector for contacting the electromechanical subassembly.

The present electromechanical subassembly constructed in this way can be produced at low costs, because the support module forming the housing can be simply produced with different terminals or electrical connecting structures such as female and male connector strips. The cover forming the control module, the mechanical module and the support module are combined in compact manner, whereby for example maintenance works can be easily performed.

In a further embodiment of the invention it is provided that the support module forms a body, into which stamped screens or grids are incorporated. These stamped screens or grids form the electrical connections within the electromechanical subassembly, i.e. between the at least one electrical connector, the first terminals and the second terminals. The support module is manufactured of an electrically non-conductive material.

In a further improvement of the invention it is provided that the electromechanical subassembly composed of the cover control module, the mechanical module and the support module comprises an approximately cuboidal structural shape. In the corners of the electromechanical subassembly four recesses or holes for joining elements, e.g. screws, are placed. Two of the recesses are embodied as a threaded hole for interconnecting the cover control module, the mechanical module and the support module. The other two recesses are embodied as a fixing hole for securing the electromechanical subassembly for example to a truck.

The cover control module is made of a thermally conductive metal, onto which a circuit arrangement comprising the first contacts is mounted.

The control module is embodied such that it forms the lid or cover of the electromechanical subassembly.

In a further improvement of the invention it is provided that in the mechanical module actuators and sensors are arranged, which form a closed loop control circuit.

The electronic control of the closed loop control circuit is advantageously included in the circuit arrangement of the cover control module.

In a further improvement of the invention it is provided that the cover control module, the mechanical module and the support module in their assembled state form a housing which is waterproof.

In a typical embodiment of the invention at least one of the connection devices or electrical connectors forms an external terminal of the electromechanical subassembly.

In a typical embodiment of the invention the terminals and contacts respectively form female and male connector strips, wherein a respective female connector strip can be assembled with the associated male connector strip in accordance with the key-lock-principle.

BRIEF DESCRIPTION OF THE DRAWINGS

The invention is explained in detail in the following text taken in conjunction with the example embodiment illustrated in the figures of the drawing, wherein:

FIG. 1 shows a view of the assembled electromechanical subassembly comprising the cover control module, the mechanical module and the support module, and FIG. 2 shows an exploded view of the individual electromechanical subassembly components comprising the cover control module, the mechanical module and the support module.

DETAILED DESCRIPTION OF A PREFERRED EXAMPLE EMBODIMENT AND OF THE BEST MODE OF THE INVENTION

FIG. 1 shows the completely assembled components of the present electromechanical subassembly 1 comprising a cover control module 2, a support module 3 and a mechanical module 4. The electromechanical subassembly 1 serves for controlling the pressure of a pneumatic system of a truck.

In this embodiment the mechanical module 4 is made of cast aluminum. Sensors 5 secured for example to the support 3, measure the pneumatic pressure of the pneumatic system. Moreover, an actuator 6 is contained in the mechanical module 4. The actuator 6 is embodied as a valve, which allows compressed air to be vented.

A connection device such as an electrical connector 3.3 is secured to the support module 3. The electrical connector 3.3 connects all electronic components of the electromechanical subassembly 1 to a power supply. The connector 3.3 also connects the electromechanical subassembly 1 to further electrical components of the truck, i.e. a compressor not shown. The support module 3 was manufactured by an injection molding method using a synthetic material which is electrically non-conductive. The electrical connector 3.3 is made in accordance with the specifications of the truck manufacturer.

FIG. 2 shows the components 2, 3 and 4 of the electromechanical subassembly 1. The cover control module 2, the support module 3 and the mechanical module 4 are interconnected by screws 8, which pass through respective holes 9.1 at two opposite corners of the electromechanical subassembly 1 which has substantially rectangular sides. For this purpose two of the holes 9.1 in the electromechanical subassembly are threaded holes. Preferably, the threaded holes 9.1 for the screws 8 are placed in the mechanical module 4 as shown. The two remaining corners of the electromechanical subassembly comprise through holes 9.2 with a suitable diameter for securing the electromechanical subassembly 1 to a truck.

The cover with its control module 2 is made substantially of an aluminum plate. A control circuit arrangement 2.2 on a printed circuit board or a ceramic plate 2.3 is secured to the inner surface of the cover control module 2. This circuit has been mounted for example by SMD technology (surface mounted device) on a printed circuit board basis or by a hybrid technology. The control circuit arrangement 2.2 comprises the closed loop control of the pneumatic system, for example a proportional closed loop control. Within this closed loop the actual value of the pneumatic pressure, as sensed by the sensor 5, is compared with a nominal or rated pressure value which is dependent e.g. from the operating state of the truck. In case the nominal value is exceeded, for instance the actuator 6 constructed as a venting valve is opened. If the sensed actual pressure is below the nominal or rated value the compressor of the truck is activated.

The circuit arrangement 2.2 of the cover control module 2 mounted on the ceramic body 2.3 comprises a first female contact strip 2.1, with several contacts for connecting the circuit arrangement 2.2 to ground, to a supply voltage and to signal lines.

A second female contact strip 4.1 is secured to the mechanical module 4. The contact strip 4.1 has several contacts for connecting the actuators 6 and the sensors 5 to ground, to a supply voltage and to signal lines.

When installing the electromechanical subassembly 1 the first female contact strip 2.1 of the cover control module 2 is connected to the first male terminal or connector strip 3.1 of the support module 3. Likewise, the second contact strip 4.1 of the mechanical module 4 is connected to a second male terminal or connector strip 3.2 of the support module 3. The first male terminal strip 3.1 and the second male terminal strip 3.2 are connected to a stamped screen or grid 3.4 embedded in the support module 3. The grid 3.4 forms the contacts of an electrical connector 3.3 made in accordance with the specifications of the truck manufacturer. A plug-in device (not shown) can be pushed into the electrical connector 3.3.

For sealing the electromechanical subassembly 1 against penetration of water, grooves can be formed for example in the support module 3 on the sides facing the cover control module 2 and the mechanical module 4. These grooves are circumferential grooves and an o-ring not shown is inserted into each groove.

The possibility that only the support module 3 is to be adapted to the customer's need allows that the electromechanical subassembly 1 can be produced at low costs. By the modular construction, which can be easily disassembled, maintenance works on the electromechanical subassembly can be simply performed.

In summary, one can say that by means of the electronic control cover subassembly 2 embodied as described, a very high degree of compatibility with the most different subassembly variants can be achieved in a very simple, but nevertheless very effective manner, without having to forego the possibility of a cost-efficient and simple production.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

The invention claimed is:

1. An electromechanical subassembly comprising a mechanical module (4) including at least one electrically controllable component (6), a support module (3) and a cover (2), said cover (2) having an electrical control circuit (2.2) forming together with said cover a control module for controlling said at least one electrically controllable component (6), a first electrical connecting structure (2.1) as part of said cover (2), a second electrical connecting structure (3.1, 3.2) as part of said support module (3) and a third electrical connecting structure (4.1) as part of said mechanical module (4), said electrical connecting structures (2.1, 3.1, 3.2, 4.1) electrically interconnecting said controllable component (6) with said electrical control circuit (2.2) of said cover (2), said support module (3) further comprising at least one electrical connector (3.3) for electrically contacting said electromechanical subassembly, and mechanical securing elements (8, 9.1) securing said cover (2) with said electrical control circuit (2.2) and said mechanical module (4) to said support module (3), wherein said cover (2) comprises a heat conducting, metal containing material, and wherein said electrical control circuit (2.2) is attached to said heat conducting, metal containing material, and wherein said first electrical connecting structure (2.1) is arranged as a part of said electrical control circuit.

2. The electromechanical subassembly of claim 1, wherein said support module (3) comprises an electrically insulating material.

3. The electromechanical subassembly of claim 1, wherein said support module (3) comprises at least one stamped conducting grid structure (3.4) for electrically connecting said at least one electrical connector (3.3) to respective connecting elements of at least one of said electrical connecting structures.

4. The electromechanical subassembly of claim 1, wherein said cover (2) having said electrical control circuit (2.2), said support module (3) and said mechanical module (4) form in the assembled state a body with rectangular sides.

5. The electromechanical subassembly of claim 1, wherein said cover (2) having said electrical control circuit (2.2), said support module (3) and said mechanical module (4) each comprises a plurality of corner regions which are axially aligned with one another in an assembled state of said electromechanical subassembly, wherein said corner regions of said cover (2) and said corner regions of said support module (3) comprise at least one through hole (9.2) each, wherein said corner regions of said mechanical module (4) comprise in addition to at least one through hole, at least one threaded hole, whereby said mechanical module (4) is connectable to said cover (2) having said electrical control circuit (2.2) and to said support module (3), and whereby said electromechanical subassembly in said assembled state is connectable to a mounting.

6. The electromechanical subassembly of claim 1, further comprising a plurality of sensors (5) and actuators (6) as part of said support module (3) and as part of said mechanical module (4).

7. The electromechanical subassembly of claim 1, wherein said mechanical module (4), said support module (3) and by said cover (2) in an assembled state thereof form a waterproof housing.

8. The electromechanical subassembly of claim 1, wherein said at least one electrical connector (3.3) forms an external terminal of said electromechanical subassembly.

9. The electromechanical subassembly of claim 1, wherein said first, second and third electrical connecting structures comprise female electrical connector strips (2.1, 4.1) and male electrical connector strips (3.1, 3.2).

10. The electromechanical subassembly of claim 9, wherein said female electrical connector strips (2.1, 4.1) are installed in said cover (2) and in said mechanical module (4), wherein said male electrical connector strips (3.1, 3.2) are installed in said support module (3) in such positions that securing said cover (2) and said mechanical module (4) to said support module (3) establishes a plurality of electrical contacts.

* * * * *